(12) United States Patent
Pisasale et al.

(10) Patent No.: US 7,385,377 B2
(45) Date of Patent: Jun. 10, 2008

(54) VOLTAGE DOWN-CONVERTER WITH REDUCED RIPPLE

(75) Inventors: Michelangelo Pisasale, Catania (IT); Maurizio Gaibotti, Cesano Maderno (IT); Michele La Placa, Cefalu' (IT)

(73) Assignee: STMicroelectronics, S.R.L. (IT)

( * ) Notice: Subject to any disclaimer, the term of this patent is extended or adjusted under 35 U.S.C. 154(b) by 0 days.

(21) Appl. No.: 11/262,294

(22) Filed: Oct. 28, 2005

(65) Prior Publication Data

US 2006/0164888 A1      Jul. 27, 2006

(30) Foreign Application Priority Data

Oct. 28, 2004   (EP)   .................................. 04105354

(51) Int. Cl.
   *G05F 1/577*   (2006.01)
   *G05F 1/20*    (2006.01)
(52) U.S. Cl. ...................... 323/267; 323/268; 323/316
(58) Field of Classification Search ........ 323/311–316, 323/267, 268
   See application file for complete search history.

(56) References Cited

U.S. PATENT DOCUMENTS

| | | | |
|---|---|---|---|
| 5,430,365 A * | 7/1995 | Taylor et al. | ................ 323/273 |
| 5,956,278 A | 9/1999 | Itou | |
| 6,232,753 B1 * | 5/2001 | Pasotti et al. | ................ 323/267 |
| 6,608,472 B1 * | 8/2003 | Kutz et al. | ................... 323/313 |
| 6,724,176 B1 * | 4/2004 | Wong et al. | ................ 323/316 |
| 6,954,059 B1 * | 10/2005 | MacLean | ..................... 323/316 |
| 2001/0012219 A1 | 8/2001 | Lee et al. | |
| 2004/0052145 A1 | 3/2004 | Sivero et al. | |

OTHER PUBLICATIONS

European Search Report, EP04105354, Mar. 10, 2005.

\* cited by examiner

*Primary Examiner*—Gary L Laxton
(74) *Attorney, Agent, or Firm*—Lisa K. Jorgenson; Graybeal Jackson Haley LLP; Bryan A. Santarelli

(57) ABSTRACT

A voltage-down converter for providing an output voltage lower than a power supply voltage of the converter is proposed. The converter includes voltage regulation means for obtaining an intermediate voltage corresponding to the output voltage from the power supply voltage by controlling a variable-conductivity element with a control signal resulting from a comparison between the intermediate voltage and a reference voltage, and an output stage for obtaining the output voltage from the power supply voltage by controlling a further variable-conductivity element with the control signal, wherein the further variable-conductivity element has a modular structure with at least one set of multiple basic modules, the converter further including means for enabling and/or disabling the modules of each set in succession according to a comparison between the output voltage and the intermediate voltage.

28 Claims, 6 Drawing Sheets

VOLTAGE DOWN-CONVERTER WITH REDUCED RIPPLE

PRIORITY CLAIM

This application claims priority from European patent application No. 04105354.7, filed Oct. 28, 2004, which is incorporated herein by reference.

TECHNICAL FIELD

The present invention relates to the electronics field. More specifically, the present invention relates to a voltage-down converter. The invention also relates to a non-volatile memory device including the voltage-down converter. Moreover, the invention further relates to a corresponding voltage-down conversion method.

BACKGROUND

Nowadays, many semiconductor memory devices are designed for working with low power supply voltages (for example, down to 1.85 V). Considering in particular a non-volatile semiconductor memory device (such as an $E^2PROM$ of the flash type), the use of a relatively low power supply voltage permits exploiting technologies based on very thin gate oxide layers, e.g. lower than 50 Å. Accordingly, it is possible to implement semiconductor memory devices that are more compact and exhibit lower power consumption.

However, in a number of applications the memory devices (albeit suitable to work at very low power supply voltages) are required to operate at higher power supply voltages (for example, 3 V or more); for example, this can happen when a memory device of a new generation has to be exploited in a system, e.g. a printed circuit board, of a previous generation (working at a higher power supply voltage).

In order to avoid the necessity to fully redesign all the existing electronic systems in which the memory devices can be used (so as to reduce their power supply voltage), countermeasures are taken by the memory device manufacturers so as to make their products directly exploitable in electronic systems working at a higher power supply voltage (so as to avoid damaging the tiny structures of the memory devices).

A typical solution is that of using dc-dc voltage-down converters for lowering the external power supply voltage to a suitable value. Preferably, the voltage-down converters are embedded in the same chip of semiconductor material wherein the memory device is integrated. Voltage-down converters known in the art consist of a voltage regulator coupled to an internal power supply line, which distributes the down-converted voltage through the chip (so as to provide it to different circuits of the memory device).

An implementation of these known voltage-down converters is based on a driver (for example, implemented with a MOS transistor), which is feedback controlled in a closed-loop configuration. This structure allows maintaining the down-converted voltage to the desired value with high accuracy (thanks to a continuous comparison between the down-converted voltage and a reference voltage).

A problem of such a solution is its stability, which can be impaired by the capacitive loads coupled to the internal power supply line; indeed, these loads can change dynamically according to the operations performed on the memory device (as a result of the enabling/disabling of different circuits thereof).

Another solution known in the art decouples the feedback circuit branch of the voltage regulator from the internal power supply line; this result is achieved by adding a distinct output stage including an additional driver (controlled by the same signal used to control the driver in the feed-back circuit branch). In this case, the operation of the feedback circuit branch is not affected by the loads coupled to the internal power supply line.

However, this open-loop solution does not permit maintaining the down-converted voltage to the desired value when the loads change dynamically (during operation of the memory device).

In any case, any transient phenomena caused by a change of the loads can have relatively long duration (at least of some tens of nanoseconds (ns)). This constraint can be incompatible with the operation of modern memory devices (which typically require current pulses with a length in the order of 50 ns).

An additional problem arises when a ripple of the down-converted voltage must be maintained within a very low range. For example, a typical situation is when this voltage is used to supply a core circuitry of the memory device (which requires a very high accuracy of its power supply voltage).

SUMMARY

According to an embodiment of the present invention, the idea of gradually controlling a modular structure of the output stage is suggested.

Particularly, an embodiment of the invention proposes a voltage-down converter for providing an output voltage lower than a power supply voltage of the converter. The converter includes voltage regulation means for obtaining an intermediate voltage (corresponding to the output voltage) from the power supply voltage; the intermediate voltage is obtained by controlling a variable-conductivity element with a control signal, which results from a comparison between the intermediate voltage and a reference voltage. An output stage is used for obtaining the output voltage from the power supply voltage; for this purpose, a further variable-conductivity element is controlled with the same control signal. The further variable-conductivity element has a modular structure with one or more sets of multiple basic modules. The converter further includes means for enabling and/or disabling the modules of each set in succession, according to a comparison between the output voltage and the intermediate voltage.

The proposed converter self-adapts to any dynamic change of the corresponding loads.

This result is achieved with a very low response time, which is acceptable in most applications.

At the same time, the proposed solution strongly reduces the ripples of the output voltage, thereby avoiding any risk for the supplied circuits (for example, when they are implemented with tiny structures).

Other embodiments of the invention described in the following may provide additional advantages.

For example, the converter may also include means for locking a current condition of each module.

This additional feature is useful to prevent continual enabling/disabling of the modules when the value of the output voltage oscillates about the desired value.

A way to further improve the solution is to provide means for enabling and/or disabling each module individually.

In this way, it is possible to force some modules to be enabled simultaneously (thereby increasing the response time of the converter); in addition or in alternative, it is possible to force the modules to be disabled simultaneously (thereby preventing any risk in critical conditions of the converter).

In another embodiment of the invention, comparison means is used for identifying a very low value, a low value, a high value, and a very high value of the output voltage (according to a comparison between the output voltage and the intermediate voltage with positive/negative margins), which values are then used to control the modules accordingly.

The proposed embodiment provides a very fine regulation of the output voltage.

Advantageously, the modules are partitioned into a main set and one or more extra sets.

This choice is a good compromise between the opposed requirements of flexibility and simplicity.

A way to further improve this embodiment is to define the main set with a higher number of modules.

The main set then groups the modules that are commonly used to control the output voltage.

As a further enhancement, the extra sets consist of a low set and a high set (with the modules of the high set that have a higher current capability).

In this way, the low set provides a fine regulation of the output voltage, while the high set is used to satisfy transient requests of very high currents.

A suggested algorithm for controlling the modules involves simultaneously disabling the modules of all the sets in response to the very high value, locking the modules of the main set and enabling in succession the modules of the low set in response to the high value, enabling in succession the modules of the low set and of the main set in response to the low value, and enabling in succession the modules of the high set in response to the very low value.

This algorithm is specifically optimized for reducing the ripple.

Alternatively, a single extra set is provided; in this case, another algorithm involves simultaneously disabling the modules of all the sets in response to the very high value, locking the modules of the main set and simultaneously enabling a predefined subset of modules of the extra set in response to the high value, enabling in succession the modules of the main set in response to the low value, and enabling in succession the modules of the extra set in response to the very low value.

The proposed embodiment of the algorithm reduces the response time of the converter (with a small increase of the ripple).

Preferably, an embodiment of the output stage includes a main module that is always enabled in an operative condition of the converter.

This main module immediately brings the output voltage close to the desired value, which is then regulated by the enabling/disabling of the other modules.

In another embodiment of the invention, the means for enabling and/or disabling each module includes a switch that is formed by a high-voltage transistor connected between a power supply terminal of the converter and the module (controlled by a general enabling signal) and a low-voltage transistor connected between the module and an output terminal of the converter (controlled by an individual enabling signal).

The low-voltage transistor provides a very fast switching time (with the high-voltage transistor that simply acts as a general switch getting the structure ready to work).

A further embodiment of the present invention provides a non-volatile memory device including one or more of the above-described converters.

A still further embodiment of the present invention provides a corresponding voltage-down conversion method.

BRIEF DESCRIPTION OF THE DRAWINGS

Features and advantages of embodiments of the invention will be best understood by reference to the following detailed description, given purely by way of a non-restrictive indication, to be read in conjunction with the accompanying drawings, in which.

DETAILED DESCRIPTION

Figure 1:
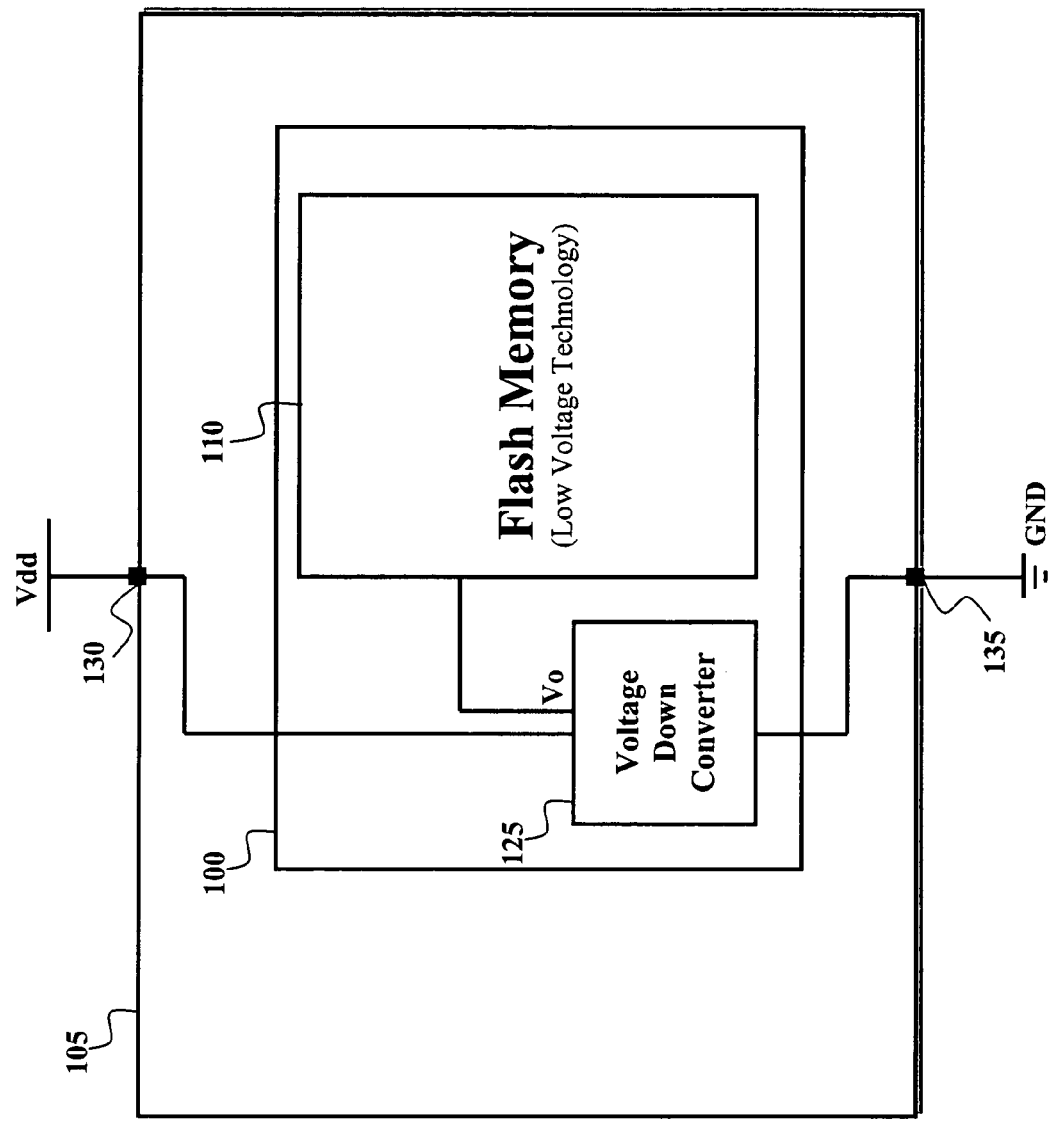
FIG. 1 shows a memory device wherein a solution according to the embodiment of the invention can be used.

With reference to the drawings, and in particular to FIG. 1, a non-volatile memory device 100 integrated in a chip 105 of semiconductor material is schematically illustrated. The memory device 100 includes, for example, an $E^2PROM$ 110 of the flash type (implemented in the 0.13-µm technology and working at a relatively low voltage, such as 1.85 V); in particular, the flash memory 110 includes a matrix of memory cells, typically consisting of floating gate MOS transistors; the flash memory 110 also embeds multiple decoders (which are used to select desired memory cells of the matrix in response to a corresponding address received from the outside), and a read/write unit (which is used to read/write the content of the selected memory cells); the read/write unit includes all the components that are necessary to execute read and write operations on the selected memory cells (such as program loads, sense amplifiers, charge pumps, pulse generators, and the like).

The memory device 100 further includes a dc-dc Voltage Down-Converter (VDC) 125, which is coupled to a power supply terminal 130 and to a reference (or ground) terminal 135; when the memory device 100 is in use (for example, it is mounted on a printed circuit board, not shown in the figure), the power supply terminal 130 and the ground terminal 135 are connected to an external power supply line Vdd and to an external ground line GND, respectively. The power supply line Vdd provides a power supply voltage Vdd (for example, +3V with respect to a reference voltage, or ground, provided by the ground line GND). The VDC 125 transforms the power supply voltage Vdd into a down-converted voltage Vo of lower value (such as 1.85 V), which is used to supply the flash memory 110.

Figure 2:
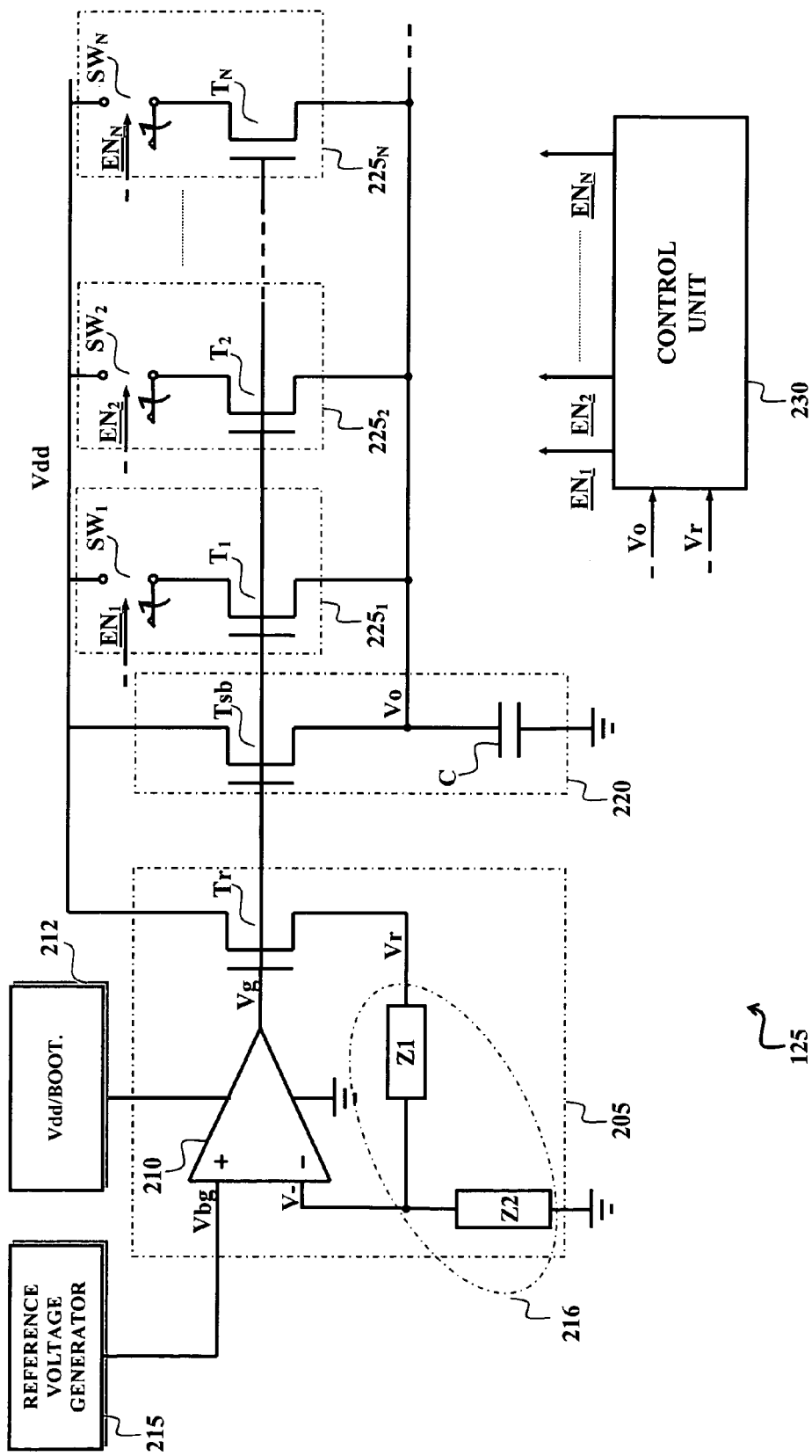
FIG. 2 shows a voltage-down converter included in the memory device according to an embodiment of the invention.

Considering now FIG. 2, the VDC 125 includes a voltage regulator 205, which is coupled to the power supply terminal (and thus to the power supply line Vdd) for receiving the power supply voltage Vdd; likewise, the voltage regulator 205 is also coupled to the ground terminal (and thus to the ground line GND) for receiving the ground voltage. The voltage regulator 205 includes an operational amplifier 210 supplied between the ground voltage and a high voltage taking the value of the power supply voltage Vdd or of a bootstrapped voltage. In detail, the operational amplifier 210 is coupled to a circuit 212, which provides the power supply voltage Vdd or the bootstrapped voltage (obtained from the power supply voltage Vdd when it is lower than a prescribed value, such as 2.4 V). The operational amplifier 210 receives a reference voltage Vbg (provided by a reference voltage generator 215 included in the flash memory) at a non-inverting input terminal "+" thereof. Preferably, the reference voltage generator 215 includes a band-gap circuit capable of providing a (band-gap) reference voltage Vbg that is very stable, particularly against operating temperature variations.

An n-MOS transistor Tr has a gate terminal connected to an output terminal of the operational amplifier 210; the output terminal of the operational amplifier 210 supplies a gate drive voltage Vg to the gate terminal of the transistor Tr, which drain terminal is coupled to the power supply line Vdd. The voltage regulator 205 further includes a negative feedback circuit branch 216 between the output terminal and an inverting input terminal "−" of the operational amplifier 210. The negative feedback circuit branch 216 includes a first bipole Z1 and a second bipole Z2 (for example, both consisting of a respective resistor of suitable resistance). In detail, the first bipole Z1 has a first terminal connected to a source terminal of the transistor Tr and a second terminal connected to the inverting input terminal "−" of the operational amplifier 210; the second bipole Z2 has a first terminal connected to the inverting input terminal "−" of the operational amplifier 210 as well, and a second terminal connected to the ground line GND. In operation, the voltage regulator 205 is adapted to cause the source terminal of the transistor Tr to reach a predefined, regulated voltage Vr.

The VDC 125 further includes a stand-by voltage driver 220, which provides an operative voltage Vo ideally the same as the regulated voltage Vr. Particularly, the stand-by voltage driver 220 includes an n-MOS transistor Tsb and a capacitor C. The transistor Tsb has a gate terminal connected to the output terminal of the operational amplifier 210, so as to be driven by the same gate voltage Vg as the transistor Tr. The drain terminal of the transistor Tsb is coupled to the power supply line Vdd, while the source terminal is connected to a first terminal of the capacitor C; a second terminal of the capacitor C is connected to the ground line GND. In operation, the first terminal of the capacitor C is intended to reach the down-converted voltage Vo.

The down-converted voltage Vo is provided to different circuits of the flash memory by means of a corresponding down-converted power supply line (denoted with the same reference Vo), which is accordingly coupled to electric loads which vary depending on the operations to be performed on the flash memory. The capacitor C holds the down-converted voltage Vo stable when current pulses are required by the loads; in other words, the capacitor C provides the required current immediately, while the corresponding electric charge lost by the capacitor C is promptly restored by the transistor Tsb. For this purpose, the capacitor C typically has a relatively high capacitance (for example, of a few nF, such as 2 nF).

Furthermore, the VDC 125 includes N additional voltage drivers $225_1$-$225_N$ (for example, N=60), which are connected in parallel to the transistor Tsb between the power supply line Vdd and the down-converted power supply line Vo. Each generic additional voltage driver $225_i$ (where i is an index equal to 1, . . . , N) includes an n-MOS transistor $T_i$ having a gate terminal coupled to the output terminal of the operational amplifier 210 (so as to be driven by the same gate voltage Vg as the transistors Tr and Tsb), and a source terminal coupled to the down-converted power supply line Vo.

Each additional voltage driver $225_i$ also includes a switch $SW_i$ for selectively decoupling the transistor $T_i$ from the power supply line Vdd. In the example at issue, the switch $SW_i$ has a first terminal connected to the drain terminal of the transistor $T_i$ and a second terminal coupled to the power supply line Vdd.

The VDC 125 further includes a control unit 230 that receives the down-converted voltage Vo and the regulated voltage Vr, and that provides enabling signals $EN_i$-$EN_N$ for selectively enabling (i.e., closing) the respective switches $SW_1$-$SW_N$ according to the result of a comparison between the down-converted voltage Vo and the regulated voltage Vr; during a stand-by condition of the flash memory, all the switches $SW_1$-$SW_N$ are preferably disabled (i.e., open). The enabling signals $EN_1$-$EN_N$ are underlined to indicate that they are asserted at a low logic value '0' (for example, corresponding to the ground voltage), and that they are deasserted at a high logic value '1' (for example, corresponding to the down-converted voltage Vo). As described in detail in the following, the switches $SW_1$-$SW_N$ are controlled by the enabling signals $EN_1$-$EN_N$ so as to provide the desired down-converted voltage Vo even when the flash memory is working (and then the loads coupled to the down-converted power supply line Vo vary depending on the operations to be performed).

The voltage regulator 205 permits obtaining the desired regulated voltage Vr thanks to the negative feed-back that varies the current sunk by the transistor Tr (from the power supply line Vdd) according to the difference between the band-gap reference voltage Vbg and a voltage V− at the inverting input terminal "−" of the operational amplifier 210. In detail, if the voltage V− is lower than the band-gap reference voltage Vbg, the gate voltage Vg increases, in turn causing an increase of the current sunk by the transistor Tr, as a result, a current flowing through the two bipoles Z1 and Z2 increases, thereby causing an increase of the voltage Vr (and then of the voltage V−). Similar considerations apply when the voltage V− is higher than the band-gap reference voltage Vbg. In other words, the negative feedback regulates the voltage Vr according to the equalization of the voltages at the two input terminals of the operational amplifier 210. By properly sizing the transistor Tr and the two bipoles Z1 and Z2, the regulated voltage Vr at the source terminal of the transistor Tr can take any desired value lower than the power supply voltage Vdd (for example, 1.85 V).

The gate voltage Vg reached at the output terminal of the operational amplifier 210 biases the gate terminals of the transistors Tsb and of the transistors $T_1$-$T_N$ in the same way. However, the number of additional voltage drivers $225_1$-$225_N$, enabled to sink a current from the power supply line Vdd, is controlled by the control unit 230 that dynamically compares the regulated voltage Vr with the down-converted voltage Vo during the operation of the flash memory.

In detail, any change in the current required by the loads coupled to the down-converted power supply line Vo inevitably causes a corresponding change in the down-converted voltage Vo. The VDC 125 is responsive to such a variation, so that the need of a greater or smaller current is compensated by enabling or disabling a number of switches $SW_1$-$SW_N$ that depends on the comparison between the current value of the down-converted voltage Vo and the value of the regulated voltage Vr. In other words, this operation performs a sort of modulation of the width W of a hypothetic single transistor, which can be deemed formed by the parallel connection of the transistors Tsb and $T_1$-$T_N$. The modulation of the width W changes the transconductance of the transistors Tsb, $T_1$-$T_N$ considered as a whole, thereby increasing or decreasing the current sunk by them from the power supply line Vdd. Particularly, when the down-converted voltage Vo is lower than the regulated voltage Vr, the control unit 230 enables a greater number of switches $SW_1$-$SW_N$; conversely, when the down-converted voltage Vo is greater than the regulated voltage Vr the control unit 230 disables a required number of switches $SW_1$-$SW_N$.

Figure 3:
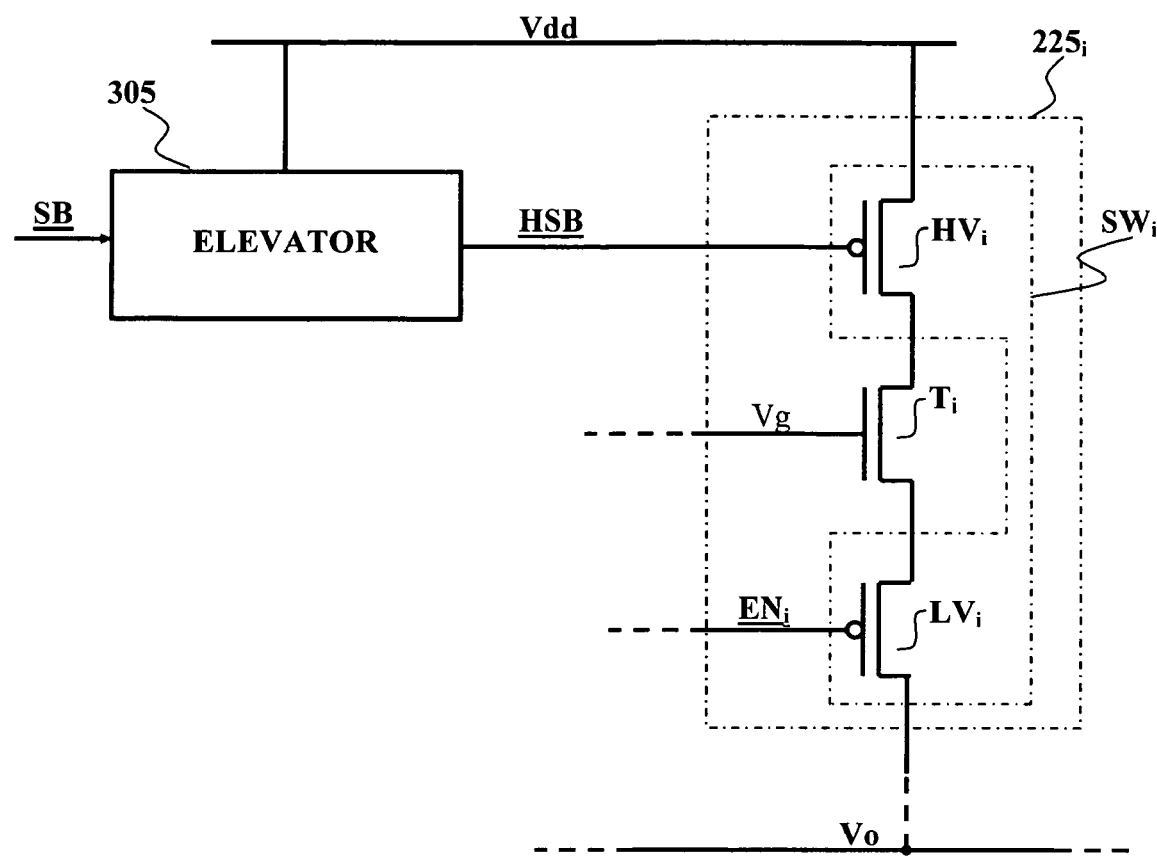
FIG. 3 illustrates a switch of the voltage-down converter according to an embodiment of the invention.

Referring now to FIG. 3, a generic switch $SW_i$ according to an embodiment of the present invention is shown. The switch $SW_i$ includes a high-voltage p-MOS transistor $HV_i$ acting as a general switching element. The high-voltage transistor $HV_i$ has the source terminal connected to the power supply line Vdd and the drain terminal connected to the drain terminal of the transistor $T_i$.

The VDC further includes a voltage elevator 305 for increasing the voltage level of a stand-by enabling signal SB, which is deasserted by the control unit (at the down-converted voltage Vo) when the flash memory is in the stand-by condition. Particularly, the voltage elevator 305 (supplied by the power supply voltage Vdd) provides an elevated enabling signal $\overline{HSB}$ (corresponding to the stand-by enabling signal SB), which takes the value of the power supply voltage Vdd when deasserted; the elevated enabling signal HSB is then provided to the gate terminal of the high-voltage transistor $HV_i$; this signal is exploited for enabling or disabling the high-voltage transistors $HV_1$-$HV_N$ of all the additional voltage drivers $225_1$-$225_N$ at a time.

Alternatively, the switch $SW_i$ may also be implemented with a high-voltage n-MOS transistor (instead of the p-MOS transistor $HV_i$); in this case, the high-voltage n-MOS transistor is driven (at its gate terminal) by the inverted elevated enabling signal HSB=$\overline{HSB}$; this signal HSB is generated from the (original) elevated enabling signal $\overline{HSB}$ by means of a high-voltage inverter, which is included in the voltage elevator 305.

The switch $SW_i$ also includes a low-voltage p-MOS transistor $LV_i$ acting as a fast switching element. The low-voltage transistor $LV_i$ has the source terminal connected to the source terminal of the transistor $T_i$ and the drain terminal connected to the down-converted power supply line Vo. The gate terminal of the low-voltage transistor $LV_i$ receives the respective enabling signal $EN_i$.

In the stand-by condition of the flash memory the stand-by enabling signal SB is deasserted and then the elevated enabling signal $\overline{HSB}$ is deasserted as well (i.e., at the power supply voltage Vdd). Accordingly, the high-voltage transistor $HV_i$ is kept switched off (since its source and gate terminals are at the same voltage). In this way, no current can be sunk from the power supply line Vdd.

When the flash memory passes from the stand-by condition to an operating condition, the stand-by enabling signal SB is asserted and then the elevated enabling signal $\overline{HSB}$ is asserted as well (to the ground voltage). Accordingly, the high-voltage transistor $HV_i$ turns on, so as to enable sinking the desired current from the power supply line Vdd when the transistor $T_i$ and the low-voltage transistor $LV_i$ are switched on. Particularly, when the enabling signal $EN_i$ is asserted, (at the ground voltage), the low-voltage transistor $LV_i$ turns on as well and the transistor $T_i$ is enabled to sink the current defined by the gate voltage Vg (applied to its gate terminal). Conversely, when the enabling signal $EN_i$ is deasserted (at the down-converted voltage Vo), the low-voltage transistor $LV_i$ remains switched off and the additional voltage driver $225_i$ is kept disabled.

As a consequence, the low-voltage transistor implements the desired modulation of the transconductance of the additional voltage drivers in a relatively short time. The high-voltage transistor, typically having a switching time longer than those of the low-voltage transistors, is exploited only as a general switch when the flash memory enters the operating condition. It has to be observed that the high-voltage transistor between the transistor of the additional voltage driver and the power supply line Vdd also avoids the presence of leakage currents and, then, reduces a power consumption in the stand-by condition. The proposed structure allows withstanding the high power supply voltage Vdd (by means of the high-voltage transistor), but at the same time provides a low switching time (thanks to the low-voltage transistor).

Figure 4:
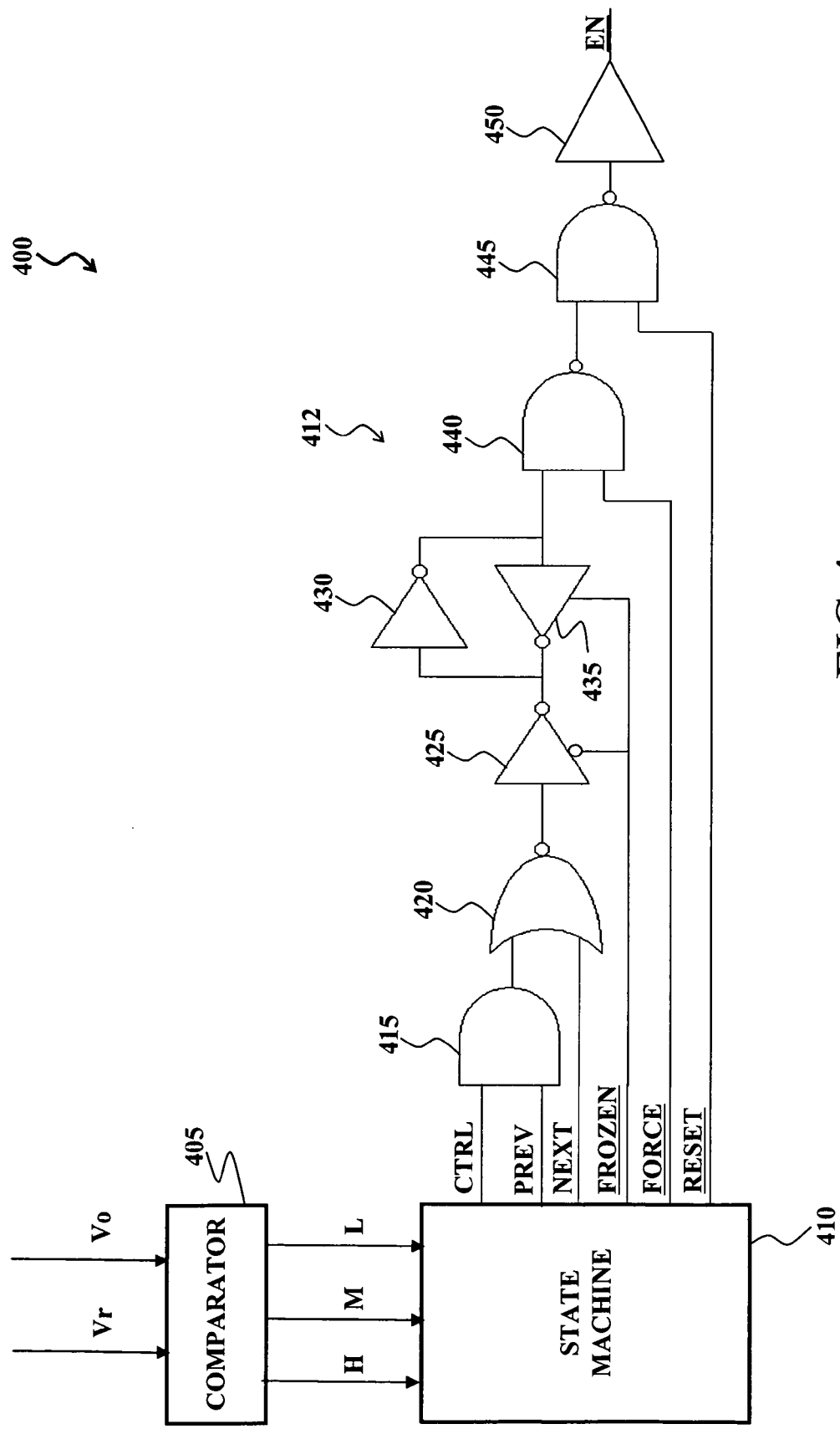
FIG. 4 shows a circuit for driving the switch according to an embodiment of the invention.

With reference now to FIG. 4, the above-described control unit includes a dedicated circuit (denoted with 400) for each switch of the corresponding additional voltage driver (for the sake of simplicity, in the following the different elements will be denoted omitting the corresponding indexes). In addition, the control unit has a central comparator 405, which receives the regulated voltage Vr and the down-converted voltage Vo; the comparator 405 (for example, implemented with a structure having a single input stage and three different output stages) provides multiple comparison signals H, M and L.

In detail, the comparison signal M is asserted when the down-converted voltage Vo is higher than the regulated voltage Vr (and it is deasserted otherwise). The comparison signals L and H are obtained by comparing the down-converted voltage Vo with the regulated voltage Vr suitably decreased or increased, respectively, by a predefined offset voltage (for example, 25 mV); particularly, the comparison signal L is asserted when the down-converted voltage Vo is higher than the regulated voltage Vr minus the offset voltage, while the comparison signal H is asserted when the down-converted voltage Vo is higher than the regulated voltage Vr plus the offset voltage. Therefore, considering a vector <HML> taking the logic values of the comparison signals H, M and L, it is possible to define four regions for the down-converted voltage Vo, as indicated in the following Table 1 (the regulated voltage Vr is assumed to be equal to 1.850 V).

TABLE 1

| Vo | <HML> |
|---|---|
| Vo > 1.875 | 111 |
| 1.850 < Vo < 1.875 | 011 |
| 1.825 < Vo < 1.850 | 001 |
| Vo < 1.825 | 000 |

The choice of three different comparison signals H, M and L (with the possibility of discriminating four regions of the down-converted voltage Vo) is a good compromise between the opposed requirements of fine regulation (needing a high number of comparison signals) and low power consumption (needing a low number of comparators and then of corresponding signals).

The comparison signals H, M and L are provided from the central comparator 405 to a state machines 410; the state machine 410 outputs a series of control signals CTRL, PREV, NEXT, FROZEN, FORCE and RESET, which are generated in response to the comparison signals H, M and L according to a predefined algorithm (as described in detail in the following).

Those control signals are passed to a combinatorial circuit 412 (for each switch), which generates the corresponding enabling signal EN accordingly. Particularly, an AND gate 415 receives the control signal CTRL at a first input terminal and the control signal PREV at a second input terminal. The control signal CTRL is asserted when the respective switch has to be enabled. The control signal PREV is instead indicative of the state of an adjacent switch; particularly, considering the additional voltage drivers in a sequence, this signal is asserted when the previous switch in the sequence is enabled. The combinatorial circuits 412 also includes a NOR gate 420 having a first input terminal connected to an output terminal of the AND gate 415 and a second input terminal receiving the control signal NEXT. The control signal NEXT is indicative of the state of another adjacent switch; particularly, this signal is asserted when the next switch in the sequence is enabled.

A NOT gate 425 has an input terminal connected to an output terminal of the NOR gate 420. The NOT gate 425 is controlled by the control signal FROZEN (so as to be enabled when the control signal FROZEN is deasserted); the control signal FROZEN is asserted when the state of the corresponding switch must be locked. In addition, the combinatorial circuit 412 includes two further NOT gates 430 and 435 connected in a loop. In detail, an input terminal of the NOT gate 430 is connected to an output terminal of the NOT gate 435 (together with an output terminal of the NOT gate 425), while an output terminal of the NOT gate 430 is connected to an input terminal of the NOT gate 435. The NOT gate 435 is controlled by the signal FROZEN (so as to be enabled when the control signal FROZEN is asserted). It has to be observed that when the control signal FROZEN is asserted, the NOT gates 430 and 435 act as a latch for temporarily storing (locking) a current logic value taken by the output terminal of the NOT gate 430.

Furthermore, the combinatorial circuit 412 includes a NAND gate 440 having a first input terminal connected to the output terminal of the NOT gate 430 and a second input terminal receiving the control signal FORCE; the control signal FORCE is asserted when the corresponding switch must be forced in the enabled state immediately. Likewise, a further NAND gate 445 has a first input terminal connected to an output terminal of the NAND gate 440 and a second input terminal receiving the control signal RESET; the control signal RESET is asserted when the corresponding switch must be forced in the disabled state immediately.

An output terminal of the NAND gate 440 is connected to an input terminal of a buffer 450, so as to supply the (buffered) enabling signal EN for the respective switch. The control signals PREV and NEXT correspond to the enabling signals EN of the previous switch and of the next switch, respectively. It should be noted that the control signals PREV and NEXT are asserted/deasserted according to the relevant enabling signals EN (and not the state of the corresponding switches); however, the time required to turn on or off the switches is so low that they can be deemed indicative of the actual state of the switches with an acceptable degree of accuracy.

In order to explain operation of the combinatorial circuit 412, let us assume that the control signals FROZEN, FORCE and RESET are all deasserted. This means that the NOT gate 425 is enabled and the loop of the NOT gates 430 and 435 is disabled; therefore, the logic value at the output terminal of the NOT gate 430 is equal to the logic value at the output terminal of the NOR gate 420 (so that the NOT gates 425-435 are opaque to the operation of the combinatorial circuit 412). Because the second input terminal of the NAND gate 440 is kept at the high logic value '1' (by the control signal FORCE), the logic value at the output terminal thereof is equal to the negation of the logic value at the output terminal of the NOT gate 430. Likewise, because the second input terminal of the NAND gate 445 is kept at the high logic value '1' (by the control signal RESET), the logic value at the output terminal thereof, and then the logic value of the enabling signal EN as well, is equal to the negation of the logic value at the output terminal of the NOR gate 440. Therefore, in this condition the enabling signal EN will always be equal to the logic value at the output terminal of the logic gate 420.

Let us assume now that the control signal CTRL is at the high logic value '1'. If also the control signal PREV is at the high logic value '1', then the output terminal of the AND gate 415 is at the high logic value '1' as well. Therefore, the output terminal of the NOR gate 420 is at the low logic value '0' (irrespective of the value of the control signal NEXT); as a result, the enabling signal EN is asserted (i.e., at the low logic value '0'). Conversely, if the control signal PREV is at the low logic value '0', then the output terminal of the AND gate 415 is at the low logic value '0' as well. Therefore, the output terminal of the NOR gate 420 is at the low logic value '0' (enabling signal EN asserted) or at the high logic value '1' (enabling signal EN deasserted) when the control signal NEXT is at the high logic value '1' or at the low logic value '0', respectively.

Let us assume now that the control signal CTRL is at the low logic value '0'; in this case, the output terminal of the AND gate 415 is at the low logic value '0' (irrespective of the logic value taken by the control signal PREV). Therefore, if the control signal NEXT is at the high logic value '1', then the output terminal of the NOR gate 420 is at the low logic value '0' (enabling signal EN asserted). Conversely, if the control signal NEXT is at the low logic value '0', the output terminal of the NOR gate 420 is at the high logic value '1' (enabling signal EN deasserted).

Summarizing, when the control signal CTRL is at the high logic value '1', the enabling signal EN is asserted so as to enable the respective switch, unless the preceding switch is disabled (in which case the considered switch remains disabled as well). On the other hand, when the control signal CTRL is at the low logic value '0', the enabling signal EN is deasserted so as to disable the respective switch, unless the next switch is enabled (in which case the considered switch remains enabled as well). Therefore, the switches are enabled in succession (like in the dominoes), i.e., a switch is enabled only if the previous switch has already been enabled; similarly, the switches are disabled in succession, i.e., a switch is disabled only if the next switch has already been disabled.

In order to allow starting the sequence of enabling/disabling, the control signal PREV of the first switch and the control signal NEXT of the last switch are always maintained at the high logic value '1' and low logic value '1', respectively. In this way, the enabling signal EN for the first switch is immediately asserted when the corresponding control signal CTRL takes the high logic value '1'; likewise, the enabling signal EN for the last switch is immediately deasserted when the corresponding control signal CTRL takes the low logic value '0'.

By enabling/disabling in succession the switches during the operation of the flash memory, any ripples of the down-converted voltage Vo are greatly reduced (or even avoided), so as to not damage, for example, tiny structures of the flash memory. It should be noted that the switches turn on in a very short time (for example, of about 0.3 ns), so that their enabling/disabling in succession is compatible with the response time required by the flash memory.

Let us assume now that the control signal FROZEN is asserted (while the control signals FORCE and RESET remain deasserted). This means that the loop of the NOT gates 430 and 435 is enabled and that the logic value at the output terminal of the NOT gate 430 is latched. In addition, the NOT gate 425 is disabled and, then, any variation of the control signals CTRL, PREV and NEXT does not change the latched logic value. In this case, the state of the considered switch is locked, i.e., the switch is kept in its current state irrespective of the logic value taken by the control signal CTRL.

On the other hand, when the control signal FORCE is asserted (and the control signal RESET is deasserted), the second input terminal of the NAND gate 440 is at the low logic value '0'; therefore, the output terminal of the NAND gate 440 is at the high logic value '1', and then the output terminal of the NAND gate 445 is at low logic value '0' (irrespective of the control signals CTRL, PREV, NEXT and FROZEN). In this way, the enabling signal EN is asserted, so as to force the switch to turn on immediately.

Conversely, when the control signal RESET is asserted, the second input terminal of the NAND gate 445 is at the low logic value '0'; therefore, the output terminal of the NAND gate 445 is at the high logic value '1' (irrespective of the control signals CTRL, PREV, NEXT, FROZEN and FORCE). In this way, the enabling signal EN is deasserted, so as to force the switch to turn off immediately.

The control signals FORCE and RESET are advantageously used to enable or disable, respectively, more switches at the same time, so as to respond quickly to a rapid increase or decrease, respectively, of the down-converted voltage Vo. Moreover, when the down-converted voltage Vo is approximately the desired value, the state of the switches can be locked in the current condition (so as to further reduce the ripple of the down-converted voltage Vo).

Figure 5:
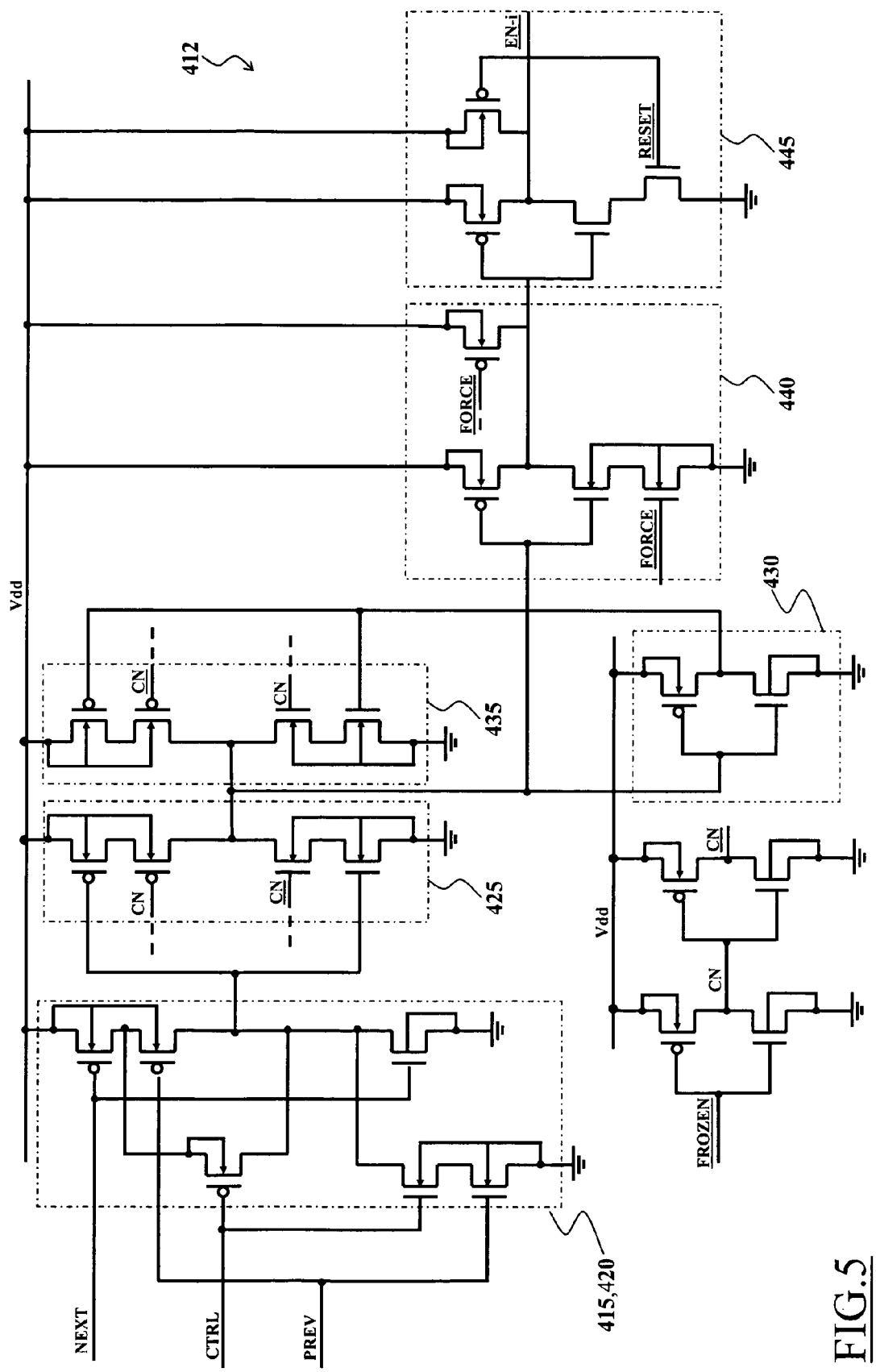
FIG. 5 shows a suggested implementation of this circuit according to an embodiment of the invention.

FIG. 5 illustrates an exemplifying implementation of the combinatorial circuit 412 according to an embodiment of the invention. The combinatorial circuit 412 is realized in the 0.13-μm technology and the architecture thereof is optimized for saving area in the corresponding chip. In the figure, the signal CN corresponds to a buffered control signal FROZEN, and the signal $\overline{CN}$ corresponds to a negation of the signal CN.

Figure 6:
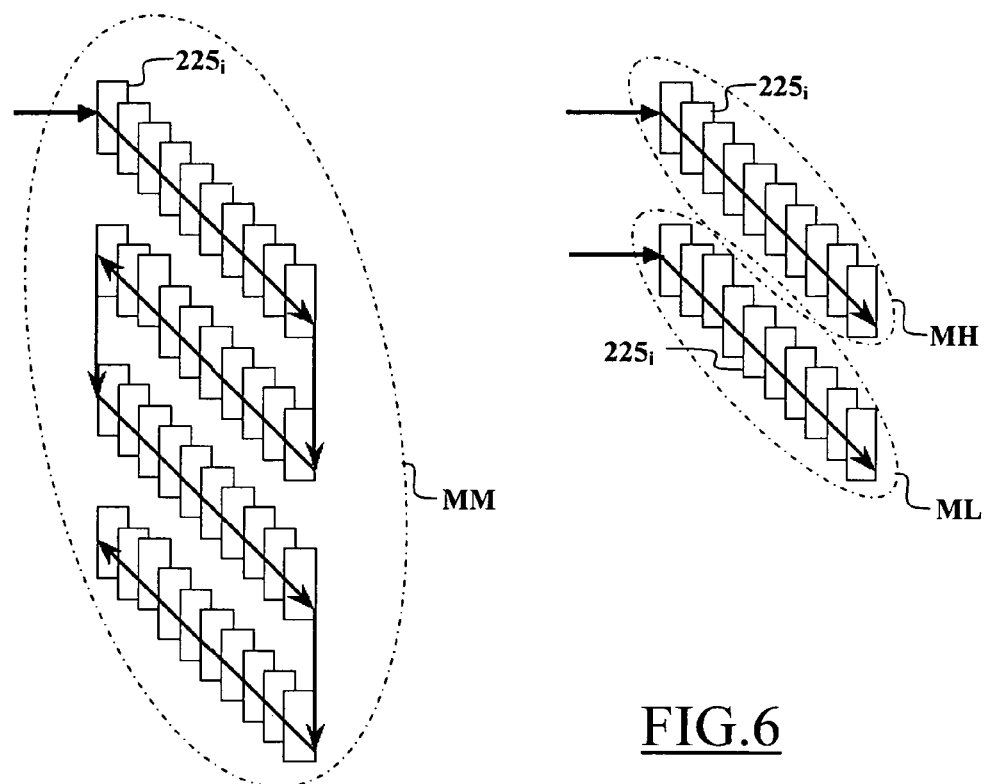
FIG. 6 schematically illustrates a logical partition of multiple voltage drivers included in the converter for implementing a control algorithm according to an embodiment of the present invention.

The above-described structure can be used to implement different algorithms for controlling the additional voltage drivers. For example, as shown in FIG. 6 (to be considered together with FIG. 4), the additional voltage drivers $225_1$-$225_N$ can be partitioned into three sets MM, ML and MH. The set MM includes Nm additional voltage drivers $225_i$, the set ML includes Nl additional voltage drivers $225_i$ and the set MH includes Nh additional voltage drivers $225_i$. The number Nm is greater than the number Nl and Nh (for example, with Nm=40, and Nl=Nh=10). Moreover, the transistors of the additional voltage drivers $225_i$ of the sets MM and ML have a low drive capability (for example, corresponding to a sunk current of about 0.7 mA), while the transistors of the additional voltage drivers $225_i$ of the sets MH have a higher drive capability (for example, twice that of the transistors of the sets MM and ML).

The proposed algorithm provides enabling/disabling the switches in succession (as illustrated by arrows in the drawing) or simultaneously in each set MM, ML, MH, depending on the region in which the value of the down-converted voltage Vo falls. In this case, the combinatorial circuits of all the switches of each set MM, ML, and MH receive respective control signals CTRL, FROZEN, FORCE and RESET taking the same value. For the sake of simplicity, in the following only the relevant control signals will be explicated in each condition (while the other control signals that are not mentioned maintain their values).

Particularly, when the vector <HML> is equal to '111', i.e. when the down-converted voltage Vo is greater than the regulated voltage Vr plus the offset voltage, the switches of all the sets MM, ML and MH are disabled simultaneously (by deasserting the three control signals CTRL); this allows the down-converted voltage Vo to decrease rapidly in potentially dangerous situations (when the down-converted voltage Vo is approaching a value that can damage the supplied circuits).

When the vector <HML> passes to '011', i.e. when the down-converted voltage Vo is between the regulated voltage Vr and the regulated voltage Vr plus the offset voltage, the current state of the switches of the set MM is locked (by asserting the corresponding control signal FROZEN). In this way, when the disabling in succession of the switches has not completed yet, it is possible to have a subset of switches (starting from the first one) that are still turned on, while the other switches are already turned off. At the same time, the switches of the set ML are enabled in succession (by asserting the respective control signal CTRL). This procedure allows a fine regulation of the down-converted voltage Vo without ripples; moreover, it avoids continual changes in the state of the switches of the set MM (when the down-converted voltage Vo moves in and out of the above-mentioned region).

When the vector <HML> passes to '001', i.e. when the down-converted voltage Vo is between the regulated voltage Vr and the regulated voltage Vr minus the offset voltage, the switches of the sets MM and ML are enabled in succession (by asserting the corresponding control signals CTRL). This procedure allows the down-converted voltage Vo to increase as desired without dangerous ripples. In this situation, if the vector <HML> returns to '011' the current state of the switches of the set MM is locked again (by asserting the corresponding control signal FROZEN). Even in this case, when the enabling in succession of the switches of the set MM has not completed yet, it is possible to have a subset of switches (starting from the last one) that are still turned off, while the other switches are already turned on.

At the end, when the vector <HML> is equal to '000', i.e. when the down-converted voltage Vo is lower than the regulated voltage Vr minus the offset voltage, the switches of the set MH are enabled in succession (by asserting the respective control signal CTRL); in this way, the down-converted voltage Vo increases rapidly when a very high current is required.

Such an algorithm ensures a very low ripple of the down-converted voltage Vo (in any case, with an acceptable response time). For example, this algorithm can be used to supply the core circuitry of the flash memory (wherein the precision of its power supply voltage is often of the utmost importance).

Figure 7:
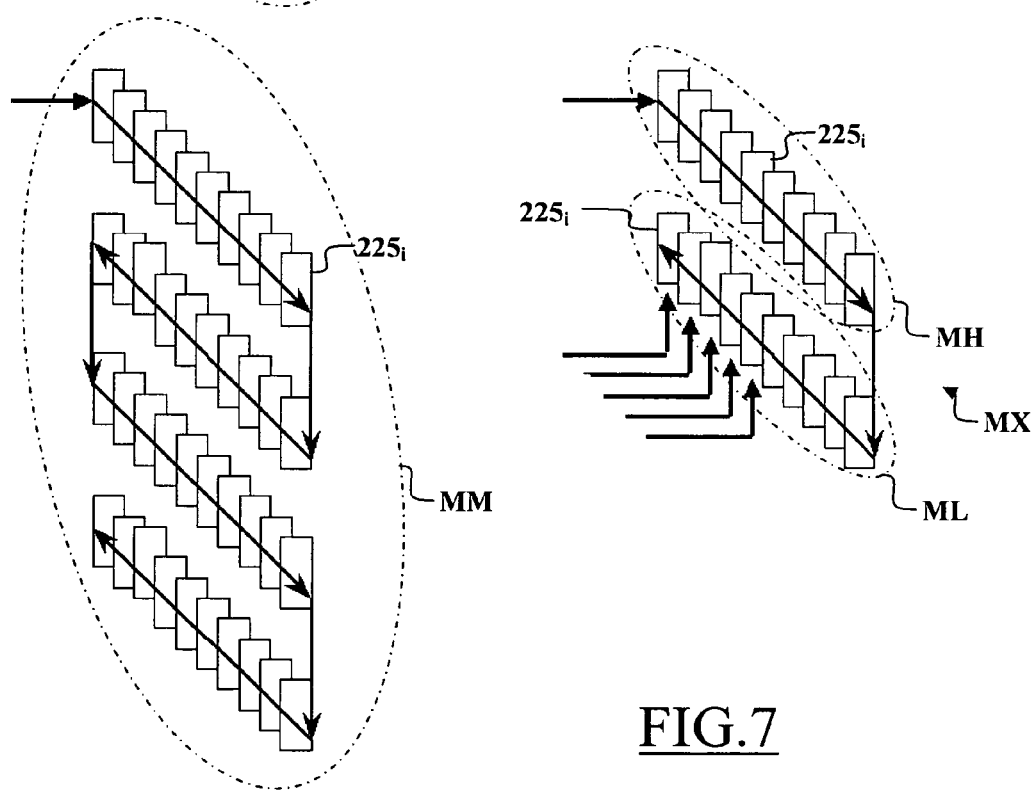
FIG. 7 schematically illustrates a different logical partition of the voltage drivers for implementing a control algorithm according to another embodiment of the present invention.

A different algorithm for controlling the additional voltage drivers is illustrated in FIG. 7. In this case, all the transistors of the additional voltage drivers $225_i$-$225_N$ have the same drive capability (for example, corresponding to a sunk current of about 0.7 mA). Moreover, the additional voltage drivers $225_i$ of the sets ML and MH are connected in succession, so as to define a single extra set MX (of 20 additional voltage drivers $225_i$ in the example at issue).

The algorithm is substantially the same as the one described above (with reference to FIG. 6). The only difference is in the region identified by the vector <HML> with the value '011', i.e. when the down-converted voltage Vo is between the regulated voltage Vr and the regulated voltage Vr plus the offset voltage.

Particularly, when the vector <HML> is equal to '111' the switches of all the sets MM, MX are disabled simultaneously (by deasserting the two control signals CTRL).

When the vector <HML> passes to '011', the current state of the switches of the set MM is locked (by asserting the corresponding control signal FROZEN). However, the algorithm now involves enabling a subset of switches of the set MX simultaneously (by asserting the control signals FORCE for all the switches of this subset). The subset preferably starts from a last switch of the set MX (so that the corresponding switches are immediately disabled when the vector <HML> returns to '111'); the subset consists of a predefined number of switches (for example, 3-7 and preferably 4-6, such as 5). This addition feature brings the down-converted voltage Vo towards the desired value more rapidly (of course, with a higher ripple).

When the vector <HML> moves to '001', the switches of the sets MM are enabled in succession (by asserting the corresponding control signal CTRL).

At the end, when the vector <HML> moves to '000', the switches of the set MX are enabled in succession (by asserting the respective control signal CTRL).

Such an algorithm ensures a very low response time (in any case with an acceptable ripple of the down-converted voltage Vo). For example, this algorithm can be used to supply the charge pumps of the flash memory (wherein the ripples of the down-converted voltage Vo are less dangerous but the rapidity in obtaining the desired value has a greater importance).

Naturally, in order to satisfy local and specific requirements, a person skilled in the art may apply to the solution described above many modifications and alterations. Particularly, although embodiments of the present invention has been described with a certain degree of particularity, it should be understood that various omissions, substitutions and changes in the form and details as well as other embodiments are possible; moreover, it is expressly intended that specific elements and/or method steps described in connection with any disclosed embodiment of the invention may be incorporated in any other embodiment as a general matter of design choice.

For example, the converter can work with a different power supply voltage Vdd and/or a different down-converted voltage Vo. Likewise, the voltage regulator (providing the gate driver voltage Vg) and/or the output stage (providing the down-converted voltage Vo) can have another structure, or can be implemented with equivalent elements (for example, replacing the n-MOS transistors with p-MOS transistors, and vice-versa). Alternatively, the transistors are controlled with an equivalent signal, or the transistors of the additional voltage drivers are enabled/disabled in another way (according to a generic comparison between the output voltage and the reference voltage); in any case, the transistors of the drivers can be replaced with equivalent variable-conductivity elements. Moreover, alternative implementations of the control unit are feasible. In any case, the possibility of enabling the switches in succession only (with the switches that are disabled always simultaneously), or vice-versa, is not excluded.

Similar considerations apply if equivalent circuits are used for locking, forcing and/or resetting each switch.

In an alternative embodiment, the control signals H, M, L are determined in another way (for example, using a positive margin and a negative margin with different values), or equivalent signals are used to identify the value of the output voltage.

Without departing from the above-described principles, it is possible to have a different number of sets, each one including another number of additional voltage drivers (or equivalent basic modules).

Moreover, it is possible to exploit transistors with different current capabilities.

The above-described concepts also apply when the subset that is forced to be enabled simultaneously consists of a different number of switches (for example, calculated as a predefined percentage of the switches of the set MX).

In any case, the stand-by module can have a different structure.

Alternatively, it is possible to use equivalent elements for implementing each switch.

The above-described concepts are also applicable when the memory device has another structure, or includes a different non-volatile memory.

Moreover, it will be apparent to those skilled in the art that the additional features providing further advantages are not essential for carrying out the above-described embodiments, and may be omitted or replaced with different features.

For example, the above-described principles also apply when the switches cannot be locked, individually enabled, and/or individually disabled.

Without departing from the above-described solutions, the switches can be controlled with a different number of signals (down to a single one obtained by comparing the output voltage with the reference voltage only, without any positive/negative margin).

Even though in the preceding description reference has been made to three sets of switches, this is not to be intended in a limitative manner (with the invention that can be put into practice even with a different number of sets, down to a single one).

In any case, an implementation with all the sets that include the same number of switches is contemplated.

Likewise, it is also possible to have all the switches with the same current capability.

However, the use of different algorithms for controlling the switches is contemplated (for example, simply enabling/disabling all the switches in succession).

Moreover, the implementation of the converter without any transistor that is always enabled in not excluded.

In any case, the converter leads itself to be put into practice even with standard switches (for enabling/disabling the additional transistors).

At the end, it should be noted that the reference to the flash memories is merely illustrative and it must not be interpreted in a limitative manner; indeed, the proposed converter can be used in a microprocessor, in a microcontroller, or more generally in any other application wherein a voltage lower than its power supply voltage is required.

Moreover, referring again to FIG. 1, the chip 105 may compose part of an electronic system, such as a computer system.

From the foregoing it will be appreciated that, although specific embodiments of the invention have been described herein for purposes of illustration, various modifications may be made without deviating from the spirit and scope of the invention.

What is claimed is:

1. A voltage-down converter for providing an output voltage lower than a power supply voltage of the converter, the converter including:
   voltage regulation means for obtaining an intermediate voltage corresponding to the output voltage from the power supply voltage by controlling a variable-conductivity element with a control signal resulting from a first comparison that is between the intermediate voltage and a reference voltage;
   an output stage for obtaining the output voltage from the power supply voltage by controlling a further variable-conductivity element with the control signal, wherein the further variable-conductivity element has a modular structure with at least one set of multiple basic modules; and
   means for enabling and/or disabling the modules of each set in succession according to a second comparison that is between the output voltage and the intermediate voltage.

2. The converter according to claim 1, further including means for locking a current condition of each module.

3. The converter according to claim 1, further including means for enabling and/or disabling each module individually.

4. The converter according to claim 1, wherein the means for enabling and/or disabling includes comparison means for identifying a very-low value, a low value, a high value, and a very-high value of the output voltage according to a comparison between the output voltage and the intermediate voltage, the intermediate voltage with a predetermined positive margin and the intermediate voltage with a predetermined negative margin, and control means for enabling or disabling the modules according to a predefined algorithm in response to the very-low value, the low value, the high value and the very-high value.

5. The converter according to claim 1, wherein the at least one set consists of a main set and at least one extra set.

6. The converter according to claim 5, wherein the main set and each of the at least one extra set include a main number of modules and a corresponding extra number of modules, respectively, the main number of modules being higher than each extra number of modules.

7. The converter according to claim 5, wherein the at least one extra set consists of a low set and a high set, and wherein each module of the main set, of the low set and of the high set has a main current capability, a low current capability and a high current capability, respectively, the high current capability being higher than the main current capability and the low current capability.

8. The converter according to claim 7, wherein the control means includes means for simultaneously disabling the modules of all the sets in response to a very-high value, means for locking the modules of the main set and for enabling in succession the modules of the low set in response to a high value, means for enabling in succession the modules of the low set (ML) and of the main set (MM) in response to a low value, and means for enabling in succession the modules of the high set in response to a very-low value.

9. The converter according to claim 5, wherein the at least one extra set comprises a single extra set, the control means including means for simultaneously disabling the modules of all the sets in response to a very-high value, means for locking the modules of the main set and for simultaneously enabling a predefined subset of modules of the extra set in response to a high value, means for enabling in succession the modules of the main set in response to a low value, and means for enabling in succession the modules of the extra set in response to a very-low value.

10. The converter according to claim 1, wherein the output stage further includes a main module being always enabled in an operative condition of the converter.

11. The converter according to claim 1, wherein the converter has a power supply terminal for receiving the power supply voltage and an output terminal for providing the output voltage, the means for enabling and/or disabling including an electronic switch for selectively connecting each module between the power supply terminal and the output terminal, means for providing a general enabling signal for all the switches, and means for providing an individual enabling signal for each switch according to the comparison between the output voltage and the intermediate voltage, wherein each switch includes a high-voltage transistor connected between the power supply terminal and the module, the high-voltage transistor being controlled by the general enabling signal, and a low-voltage transistor connected between the module and the output terminal, the low-voltage transistor being controlled by the corresponding individual enabling signal.

12. A non-volatile memory device suitable to be supplied by an external power supply voltage, the memory device including internal circuits suitable to be supplied by an internal power supply voltage lower than the external power supply voltage, and at least one converter according to claim 1 for obtaining the internal power supply voltage from the external power supply voltage.

13. A method for converting a power supply voltage into an output voltage lower than the power supply voltage, the method including the steps of:
   regulating a control signal according to a first comparison that is between an intermediate voltage and a reference voltage, the intermediate voltage being obtained from the power supply voltage by controlling a variable-conductivity element with the control signal, and
   obtaining the output voltage from the power supply voltage by controlling a further variable-conductivity element with the control signal,
   wherein
      the further variable-conductivity element has a modular structure with at least one set of multiple basic modules, the step of obtaining the output voltage from the power supply voltage including enabling and/or disabling the modules of each set in succession according to a second comparison that is between the output voltage and the intermediate voltage.

14. A voltage converter, comprising:
   a supply node operable to receive a supply voltage;
   an output node;
   a voltage regulator coupled to the supply node and operable to generate a regulated intermediate voltage and a control signal that causes the regulated intermediate voltage to have a predetermined level;
   an output driver coupled to the voltage regulator, having a controllable impedance coupled between the supply and output nodes, and being operable to generate a regulated output voltage on the output node in response to the control signal, the controllable impedance including impedance modules each having a respective impedance in response to a respective select signal; and
a control unit coupled to the voltage regulator and to the output driver and operable to adjust the controllable impedance and generate the respective select signals in response to the regulated intermediate and output voltages.

15. The voltage converter of claim 14 wherein the voltage regulator comprises:
an amplifier that is operable to compare a reference voltage to a feed back voltage and to generate the control signal in response to the comparison; and
a network coupled to the amplifier and operable to generate the feed back voltage from the regulated intermediate output voltage.

16. The voltage converter of claim 14 wherein:
the controllable impedance of the output driver comprises,
first and second transistors each having a respective first node coupled to the supply node, a respective second node coupled to the output node, and a respective control node operable to receive the control signal, and
a first switch coupled between the supply node and the first node of the first transistor and operable to close in response to a select signal having a first value and to open in response to the select signal having a second value; and
the control unit is operable to generate the select signal in response to the regulated intermediate and output voltages.

17. The voltage converter of claim 14 wherein:
the controllable impedance of the output driver comprises,
first, second, and third transistors each having a respective first node coupled to the supply node, a respective second node coupled to the output node, and a respective control node operable to receive the control signal,
a first switch coupled between the supply node and the first node of the first transistor and operable to close in response to a first select signal having a first value and to open in response to the select signal having a second value, and
a second switch coupled between the supply node and the first node of the second transistor and operable to close in response to a second select signal having the first value and to open in response to the select signal having the second value; and
the control unit is operable to generate the first and second select signals in response to the regulated intermediate and output voltages.

18. The voltage converter of claim 14 wherein:
the controllable impedance of the output driver comprises,
first, second, and third transistors each having a respective first node coupled to the supply node, a respective second node coupled to the output node, and a respective control node operable to receive the control signal,
a first switch coupled between the supply node and the first node of the first transistor and operable to close in response to a first select signal having a first value and to open in response to the select signal having a second value, and
a second switch coupled between the supply node and the first node of the second transistor and operable to close in response to a second select signal having the first value and to open in response to the select signal having the second value; and
the control unit is operable to generate the first select signal having the first value at a time and to generate the second select signal having the first value at a subsequent time in response to the regulated intermediate voltage being greater than the regulated output voltage.

19. The voltage converter of claim 14 wherein:
the controllable impedance of the output driver comprises,
first, second, and third transistors each having a respective first node coupled to the supply node, a respective second node coupled to the output node, and a respective control node operable to receive the control signal,
a first switch coupled between the supply node and the first node of the first transistor and operable to close in response to a first select signal having a first value and to open in response to the select signal having a second value, and
a second switch coupled between the supply node and the first node of the second transistor and operable to close in response to a second select signal having the first value and to open in response to the select signal having the second value; and
the control unit is operable to generate the first select signal having the second value at a time and to generate the second select signal having the second value at a subsequent time in response to the regulated output voltage being greater than the regulated intermediate voltage.

20. The voltage converter of claim 14 wherein the control unit is operable to:
cause the controllable impedance to have a first value in response to the regulated output voltage being greater than a sum of the regulated intermediate voltage and a predetermined offset voltage;
cause the controllable impedance to have a second value in response to the regulated output voltage being less than the sum and being greater than the regulated intermediate voltage;
cause the controllable impedance to have a third value in response to the regulated output voltage being less than the regulated intermediate voltage and greater than a difference between the regulated intermediate voltage and the predetermined offset voltage; and
cause the controllable impedance to have a fourth value in response to the regulated output voltage being less than the difference.

21. The voltage converter of claim 14 wherein the control unit is operable to:
cause the controllable impedance to have a first value in response to the regulated output voltage being greater than a sum of the regulated intermediate voltage and a predetermined offset voltage;
cause the controllable impedance to have a second value that is less than the first value in response to the regulated output voltage being less than the sum and being greater than the regulated intermediate voltage;
cause the controllable impedance to have a third value that is less than the second value in response to the regulated output voltage being less than the regulated intermediate voltage and greater than a difference between the regulated intermediate voltage and the predetermined offset voltage; and cause the controllable impedance to have a fourth value that is less than the third value in response to the regulated output voltage being less than the difference.

22. An integrated circuit, comprising:
a voltage converter including,
  a supply node operable to receive a supply voltage,
  an output node,
  a voltage regulator coupled to the supply node and operable to generate a regulated intermediate voltage and a control signal that causes the regulated intermediate voltage to have a predetermined level,
  an output driver coupled to the voltage regulator, having a controllable impedance coupled between the supply and output nodes, and being operable to generate a regulated output voltage on the output node in response to the control signal, the controllable impedance including impedance modules each having a respective impedance in response to a respective select signal, and
  a control unit coupled to the voltage regulator and to the output driver and operable to adjust the controllable impedance and generate the respective select signals in response to the regulated intermediate and output voltages.

23. A system, comprising:
an integrated circuit including,
  a voltage converter including,
    a supply node operable to receive a supply voltage,
    an output node,
    a voltage regulator coupled to the supply node and operable to generate a regulated intermediate voltage and a control signal that causes the regulated intermediate voltage to have a predetermined level,
    an output driver coupled to the voltage regulator, having a controllable impedance coupled between the supply and output nodes, and being operable to generate a regulated output voltage on the output node in response to the control signal, the controllable impedance including impedance modules each having a respective impedance in response to a respective select signal, and
    a control unit coupled to the voltage regulator and to the output driver and operable to adjust the controllable impedance and generate the respective select signals in response to the regulated intermediate and output voltages.

24. A method, comprising:
generating from a supply voltage on a supply node a regulated intermediate voltage in response to a control signal;
generating from the supply voltage a regulated output voltage on an output node in response to the control signal; and
setting a value of an impedance between the supply node and the output node in response to the regulated intermediate and output voltages, wherein setting the value of the impedance includes,
  lowering the value of the impedance by increasing a number of impedance circuits disposed between the supply and output nodes, and
  raising the value of the impedance by decreasing a number of impedance circuits disposed between the supply and output nodes.

25. The method of claim 24, further comprising:
generating a feed back signal from the regulated intermediate voltage; and
generating the control signal having a value that causes the feed back signal to substantially equal a reference signal.

26. The method of claim 24 wherein setting the value of the impedance comprises lowering the value of the impedance in response to a decrease in the regulated output voltage.

27. The method of claim 24 wherein setting the value of the impedance comprises raising the value of the impedance in response to an increase in the regulated output voltage.

28. The method of claim 24 wherein setting the value of the impedance comprises:
lowering the value of the impedance by increasing a number of transistors that are coupled between the supply and output nodes and that have respective control nodes coupled to receive the control signal; and
raising the value of the impedance by decreasing a number of transistors that are coupled between the supply and output nodes and that have respective control nodes coupled to receive the control signal.

* * * * *